United States Patent [19]

Bach et al.

[11] Patent Number: 5,252,432
[45] Date of Patent: Oct. 12, 1993

[54] PRODUCTION OF PHOTOPOLYMERIC FLEXOGRAPHIC RELIEF PRINTING PLATES

[75] Inventors: Helmut Bach, Bad Durkheim; Thomas Telser, Weinheim; Gernot Dietz, Eisenberg, all of Fed. Rep. of Germany

[73] Assignee: BASF Aktiengesellschaft, Ludwigshafen, Fed. Rep. of Germany

[21] Appl. No.: 4,673

[22] Filed: Jan. 14, 1993

Related U.S. Application Data

[63] Continuation of Ser. No. 719,906, Jun. 24, 1991, abandoned.

Foreign Application Priority Data

[30] Jun. 27, 1990 [DE] Fed. Rep. of Germany ....... 4020372

[51] Int. Cl.$^5$ .............................................. G03F 7/00
[52] U.S. Cl. .................................... 430/306; 430/309; 430/325; 430/331
[58] Field of Search ............... 430/306, 309, 325, 331

[56] References Cited

U.S. PATENT DOCUMENTS

| | | | |
|---|---|---|---|
| 3,984,582 | 10/1976 | Feder et al. | 427/43 |
| 4,452,879 | 6/1984 | Fickes et al. | 430/306 |
| 4,806,452 | 2/1989 | Hoffmann et al. | |
| 4,847,182 | 7/1989 | Worns et al. | |
| 4,994,344 | 2/1991 | Kurtz et al. | 430/306 |

FOREIGN PATENT DOCUMENTS

| | | |
|---|---|---|
| 2001489 | 4/1990 | Canada . |
| 2001490 | 4/1990 | Canada . |
| 2001491 | 4/1990 | Canada . |
| 355789 | 8/1989 | European Pat. Off. . |
| 0355789 | 2/1990 | European Pat. Off. . |

*Primary Examiner*—Jack P. Brammer
*Attorney, Agent, or Firm*—Keil & Weinkauf

[57] ABSTRACT

In a novel, improved process for the production of photopolymeric flexographic relief printing plates from photosensitive recording elements which contain A) a dimensionally stable substrate and
B) at least one photopolymerizable recording layer having
  $b_1$) at least one elastomeric polymer as a binder,
  $b_2$) at least one photopolymerizable monomer which is compatible with the binder ($b_1$) and
  $b_3$) at least one photopolymerization initiator, by
(1) imagewise exposure of the photopolymerizable recording layer (B) to actinic light and
(2) washout (development) of the unexposed and therefore nonphotopolymerized parts of the imagewise exposed recording layer (B) with an organic developer with formation of a relief layer, the organic developers used are 3-methoxy-n-butyl acetate and/or n-butyl glycolate.

5 Claims, No Drawings

PRODUCTION OF PHOTOPOLYMERIC FLEXOGRAPHIC RELIEF PRINTING PLATES

This application is a continuation of application Ser. No. 07/719,906, filed on Jun. 24, 1991 now abandoned.

The present invention relates to an improved process for the production of photopolymeric flexographic relief printing plates from photosensitive recording elements which contain A) a dimensionally stable substrate and
B) at least one photopolymerizable recording layer having
  $b_1$) at least one elastomeric polymer as a binder,
  $b_2$) at least one photopolymerizable monomer which is compatible with the binder ($b_1$) and
  $b_3$) at least one photopolymerization initiator, by
(1) imagewise exposure of the photopolymerizable, photosensitive recording layer (B) to actinic light and
(2) washout (development) of the unexposed and therefore nonphotopolymerized parts of the imagewise exposed recording layer (B) with an organic developer with formation of a relief layer.

Apart from the improvement according to the invention, a process of this type is generally known. The developers which have usually been used are
(i) chlorohydrocarbons, such as chloroform, trichloroethylene, tetrachloroethylene or trichloroethane as such or as a mixture with lower alcohols, such as n-butanol;
(ii) saturated cyclic and acyclic hydrocarbons, such as petroleum ether, hexane, heptane, octane, cyclohexane or methylcyclohexane;
(iii) aromatic hydrocarbons, such as benzene, toluene or xylene; or
(iv) lower aliphatic ketones, such as acetone, methyl ethyl ketone or methyl isobutyl ketone.

A disadvantage of all of these known procedures is that the developer has to be allowed to act for a long time in order to achieve a satisfactory washout effect. The relief layers have frequently exhibited surface swelling, or parts of the relief have been underwashed and in certain circumstances mechanically detached. Furthermore, when conventional saturated or aromatic hydrocarbons and ketones are used, long drying times have been necessary, frequently leading to the feared phenomenon of "positive internal overmatter", i.e. finer image elements projecting above the level of solid areas. Not least, these developers, apart from the chlorohydrocarbons, have low flashpoints of less than 21° C., necessitating the use of special explosion-protected plants for carrying out the process. On the other hand, the use of chlorohydrocarbons has given rise to disposal problems, owing to their toxicity. Although these developers have excellent dissolving power, the photopolymeric flexographic relief printing plates which have been produced with the aid of these developers have had an unsatisfactory side-wall structure and a striking, wrinkled surface structure, i.e. the orange peel effect.

The requirements set for the performance characteristics of photopolymeric flexographic relief printing plates in practice have in the meantime steadily increased. For example, on the basis of present expectations photopolymeric flexographic relief printing plates should be capable of being produced in a particularly simple, environmentally compatible, reliable manner from photosensitive recording elements, should reproduce the original completely true to detail after their production, should be ozone-resistant, should not have a tacky surface, should be resistant to the solvents of the customarily used flexographic printing inks under pressure conditions and should give excellent printed copies in a particularly long print run. These requirements are dependent not only on the composition of the particular photosensitive recording elements used but also on the manner in which they are further processed to photopolymeric flexographic relief printing plates. It is therefore essential constantly to develop the conventional procedures to keep pace with the steadily growing practical requirements.

For example, EP-A-0 228 676 (U.S. Pat. No. 4 806 452) discloses a process of the type stated at the outset, in which branched or straight-chain, monoolefinically to triolefinically unsaturated acyclic hydrocarbons, alcohols or ketones of 8 to 15 carbon atoms and/or saturated or monoolefinically to triolefinically unsaturated cyclic aliphatic hydrocarbons, alcohols or ketones of 8 to 15 carbon atoms are used as essential components of the organic developers. Examples of suitable hydrocarbons, alcohols or ketones of 8 to 15 carbon atoms are 1-octene, cyclooctane, cyclooctene, cyclooctanol, cyclooctanone, 3-nonene, mono- and sesquiterpenes and terpentine oils. Among these, the monoterpenes, for example p-menthane, borneol, menthone, D- and L-limonene, α-terpineol, α-terpinene, α-terpinene, terpinolene, α-pinene, β-pinene, δ-pinene and citronellol, are regarded as advantageous. The organic developers, which may contain one or more of these compounds, in particular limonene, contain up to about 40% by weight, based on the total amount, of other solvents. The alcohols known from the abovementioned prior art, in particular relatively high boiling alcohols, are said to be suitable in an amount of 20% by weight.

Although this known process can be carried out in washers which are not explosion protected and gives good to very good photopolymeric flexographic relief printing plates, the organic developers used in this process have such an intense natural odor that the process can be carried out only in particularly intensively ventilated factory rooms, which constitutes a serious disadvantage.

The process, of the type stated at the outset and disclosed in EP-A-0 332 070 constitutes a certain advance in this respect. In this known process, hydrogenated mineral oil fractions boiling within a range from 160° to 220° C. and having a flashpoint of greater than 45° C. are used as organic developers. These hydrogenated mineral oil fractions are said to have an aromatics content of less than 1% and a content of naphthenic hydrocarbons of from 0.5 to 50%. Such products are known and conventionally used and are sold, for example, by Exxon under the brand names Exxsol D, Nappar, Norpar or Isopar, by Esso under the trade name or trademark Shellsol D or by Hydrocarbures under the trade name or trademark Hydrosol P.

These developers are furthermore said to contain alcohols of 4 to 8 carbon atoms, such as n-butanol, n-pentanol, isobutanol or hexanol. The content is said to be not less than 5, preferably 20%, by volume. Moreover, it is said that in addition surfactants in an amount of not more than 2% by weight, or odor-improving additives, such as limonene, pinene or citronellol, in an amount of not more than 10% by weight, may be added to this known organic developer. Although this known process does not give rise to such serious odor problems as the process disclosed in EP-A-0 228 676 and also gives good to very good photopolymeric flexographic relief printing plates which have an excellent surface and no orange peel effect and exhibit little or no swelling, the use of these developers leads to relatively long washout times, which is particularly disadvantageous in the washout of thick printing plates, and long drying times result, which is unacceptable in practice. Furthermore, icicling may occur on the surface of the photopolymeric flexographic relief printing plates in certain circumstances, due to undissolved or reprecipitated polymer residues.

U.S. Pat. No. 4 847 182 discloses a variant of the process disclosed in EP-A-0 228 676. In this variant, nonsolvents, such as n-butanol, 2-ethoxyethanol, benzyl alcohol, ethanol, 2-butoxyethanol, isopropyl alcohol, 2-(2-butoxyethoxy)-ethanol, mineral oil, mineral spirits, naphtha, decane or octane, are added to the organic developers, which mainly consist of terpenes. These nonsolvents are said to precipitate the washed-out materials from the particular organic developer used, thus simplifying the working up thereof. Furthermore, the use of the terpenes and the nonsolvents in the form of aqueous emulsions is recommended. As furthermore disclosed in the examples of U.S. Pat. No. 4 847 182, large amounts of surfactants must be concomitantly used. Apart from the fact that this process does not solve the problems associated with the intense odor of the terpenes used here, the preparation of the emulsions frequently gives rise to considerable difficulties in practice because they tend to exhibit very pronounced foaming.

EP-A-0 355 789 discloses a process for which the organic developers are selected from the following classes of compounds:
(i) diethylene glycol dialkyl ethers having alkyl groups which contain 1 to 5 carbon atoms;
(ii) esters of acetic acid with saturated alcohols of 6 to 10 carbon atoms or with alkoxy-substituted saturated alcohols of 6 to 10 carbon atoms;
(iii) esters of carboxylic acids of 6 to 10 carbon atoms with alcohols of 1 to 6 carbon atoms and
(iv) esters of alkoxy-substituted carboxylic acids of 2 to 4 carbon atoms, where the alkoxy radical is of 1 to 4 carbon atoms, with an alcohol of 1 to 4 carbon atoms.

Among these, diethylene glycol diethyl ether, 3,5,5-trimethylhexyl acetate, 2-butoxyethyl acetate (butylglycol acetate), 2-ethylbutyl acetate, 2-cyclohexylethyl acetate, 2-ethylhexyl acetate or mixtures thereof, ethyl octanoate, 2-pentyl hexanoate, ethyl nonanoate or ethyl 3-ethoxypropionate are said to be advantageous. Among these in turn, it is said that ethyl 3-ethoxypropionate, mixtures of nonyl acetates, 2-ethylhexyl acetate and diethylene glycol diethyl ether or mixtures of 3,5,5-trimethylhexyl acetate, 2-ethylhexyl acetate and diethylene glycol diethyl ether are particularly preferably used. Furthermore, these organic developers are said to contain in addition from 5 to 40% by volume or by weight (which is relevant here remains unclear) of alcohols, such as butanol, benzyl alcohol or 2-ethylhexanol.

In practice, the use of the alkyl esters as organic developers is very disadvantageous because each member of this class of compounds has its own typical intense ester odor. This intense odor has very adverse effects on the personnel in the reprographic unit, who after a certain time find the virtually proverbial intense ester odor unbearable. Another disadvantage of the process disclosed in EP-A-0 355 789 is that the organic developers used here result in very pronounced swelling of the developed imagewise exposed recording layers and cause the highly undesirable orange peel effect on the printing surface of the photopolymeric flexographic relief printing plates.

Compared with the alkyl esters, 2-butoxyethyl acetate is to be regarded as substantially odorless. However, the disadvantage of this ester is that its dissolving or dispersing power is unsatisfactory and thus leads to comparatively long washout times, the drying times are relatively long and it causes severe skin irritation, a problem worsened by the particularly easy absorption of the ester through the human skin. Special safety measures therefore have to be taken in the reprographic unit for the handling of 2-butoxyethyl acetate in large amounts, in order to avoid exposure of the personnel. These disadvantages are not compensated for by the weak odor of this ester.

Disadvantages of this type also occur in the process disclosed in DE-A-38 36 402, which is supposed to employ esters of the general formula I

(I)

where $R^1$ and $R^2$ can be identical or different and are each n- or isoalkyl of 1 to 13 carbon atoms, cycloalkyl of 5, 6 or 12 carbon atoms, alkylaryl where the alkyl radical is of 1 to 3 carbon atoms and the aryl radical is of 6 carbon atoms, or aryl of 6 or 10 carbon atoms, the sum of the carbon atoms in the radicals $R^1$ and $R^2$ being from 6 to 13. In particular, amyl acetate, isoamyl acetate, hexyl acetate, cyclohexyl acetate, ethylhexyl acetate, nonyl acetate, isononyl acetate, propyl propionate, propyl butyrate, butyl butyrate, isobutyl butyrate, benzyl acetate and methyl benzoate are said to be used here, all these being compounds which have a more or less intense odor.

Further processes are disclosed in DE-A-38 36 404 and DE-A-38 36 403.

In the process of DE-A-38 36 404, phenol ethers of the general formula II

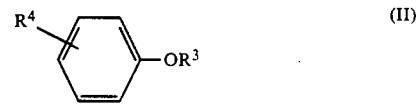

(II)

where $R^3$ is n- or isoalkyl of 1 to 6 carbon atoms, cycloalkyl or aryl of 6 to 12 carbon atoms and $R^4$ is hydrogen or n- or isoalkyl of 1 to 6 carbon atoms or a radical $-OR^3$, are said to be used. Among these, methyl phenyl ether, ethyl phenyl ether, isopropyl phenyl ether, propyl phenyl ether, o-cresyl methyl ether, m-cresyl methyl ether, p-cresyl methyl ether, resorcinol dimethyl ether and pyrocatechol ethyl ether are supposed to be advantageous.

In comparison, the process of DE-A-38 36 403 employs aromatics of the general formula III

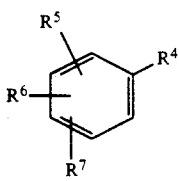

(III)

where $R^4$ to $R^7$ may be identical or different and are each hydrogen or n- or isoalkyl of 1 to 5 carbon atoms, and, if they are directly adjacent to one another, $R^4$ and $R^5$ may furthermore form a cycloaliphatic ring having 5 or 6 ring carbon atoms, the latter preferably not being substituted and the sum of the carbon atoms of the substituents and of the ring members being from 9 to 13. Among these, in particular isopropylbenzene, n-propylbenzene, 1-methyl-3-ethylbenzene, 1,3,5-trimethylbenzene, 1-methyl-2-ethylbenzene, 1,2,4-trimethylbenzene, iso-butylbenzene, sec-butylbenzene, 1,2,3-trimethylbenzene, 1-methyl-4-isopropylbenzene, indane, indene, 1,3-diethylbenzene, 1-methyl-4-propylbenzene, n-butylbenzene, 1-methyl-3-propylbenzene, 1,2,4,5-tetramethylbenzene, dimethylethylbenzene, methylindane or n-pentylbenzene is used.

Although these two processes make use of compounds which do not have quite such an intense odor as the esters, some of them are nevertheless very unpleasant. This makes it possible to ameliorate the particularly intense odor nuisance due to the esters, although only to a degree. However, there is still the serious disadvantage that the developers of DE-A-38 36 404 and DE-A-38 36 403 are exclusively aromatic solvents which in the end will give rise to more or less major toxicological, occupational hygiene, safety and ecological problems.

Further disadvantages emerge from a consideration of the following technical situation:

During washout (development) of the imagewise exposed recording layers (B), the exposed and therefore photopolymerized parts of the recording layer (B) absorb the solvent. This process is usually referred to as swelling. The extent of the swelling can be quantified by separate determination of the increase in layer thickness and/or the increase in the weight of the recording layer (B) completely exposed and then treated with the relevant developer. In practice, the swelling of the imagewise exposed and developed recording layers (B), i.e. the relief layers, of the photopolymeric relief printing plates is generally from 5 to 10% by weight. Converted into layer thicknesses, this means an increase in layer thickness of, for example, from 150 to 300 μm in the case of a 3 mm thick photosensitive recording layer (B) or in the case of the relief layer produced therefrom.

The drying is intended to remove the organic developer absorbed by the relief layer of the photopolymeric flexographic relief printing plate. In practice, the error is often made of completely ending the drying when the photopolymeric flexographic relief is printing plate or its relief layer has once again reached its initial thickness or its initial weight. The fact that during washout (development) the original imagewise exposed recording layer (B) not only absorbs organic developers but also exchanges low molecular weight constituents, for example plasticizers or other assistants, for the organic developer is overlooked. Thus, swelling and extraction take place simultaneously, so that the swelling values usually stated reflect not the swelling as such but in reality the sum of swelling and extraction.

If, in the process under discussion, an organic solvent which has a particularly pronounced extraction effect is used, and the photopolymeric flexographic relief printing plates developed therewith are dried to actual constancy of weight or of thickness, which generally requires several days, the weight or the thickness will be substantially smaller than the initial weight or the initial layer thickness, respectively, of the relief layer of the said plate.

If, on the other hand, the photopolymeric flexographic relief printing plates are dried only until the initial weight or the initial layer thickness is reached, in accordance with the conventional procedure, their relief layers inevitably still contain large amounts of organic solvents. These residual solvents are, however, nonuniformly distributed in the relief layers. Thus, fine structures, for example screens having a large surface per unit volume, possess much higher swelling values than solid areas. This also applies to the edges of these solid areas, which swell to a greater extent than their center. Consequently, the fine structures and the edges of the solid areas in the relief layer of the photopolymeric flexographic relief printing plate project to a greater extent than, for example, the center of the solid areas. These inhomogeneities and different heights (tolerances) are also caused, and reinforced, by the nonuniform temperature distribution which is always present in the drier. If these tolerances become widespread in a photopolymeric flexographic relief printing plate, they make the latter useless.

Even if the amount of residual solvent still present does not directly lead to the relevant photopolymeric flexographic relief printing plate becoming useless, it nevertheless causes long-term shrinkage, i.e. the relief layer of the relevant plate changes its dimensions as a result of evaporation of the residual solvent on prolonged storage or prolonged use. Because of the long-term shrinkage, different printed copies are obtained with one and the same plate after prolonged storage or use, which is unacceptable in practice.

This disadvantage becomes particularly acute in practice when, after prolonged use, one of the four photopolymeric flexographic relief printing plates of a flexographic four-color set can no longer be used and from now on has to be replaced by a relief printing plate which has to be newly produced, is identical in motif and in its dimensions and prints the relevant color separation in a manner exactly matching the other three color separations. However, such rapid replacement is no longer possible when the photopolymeric flexographic relief printing plates of the four-color set have suffered long-term shrinkage, because in this case the newly produced relief printing plate no longer matches the other three in its dimensions. If this is the case, all that remains is the time-consuming and expensive option of producing again all four relief printing plates of the four-color set.

Apart from the fact that it is very desirable to reduce or even to completely overcome any disadvantages of the conventional processes of the type stated at the outset by varying their parameters, in particular the organic developers, it is also necessary to use other methods of measurement in checking the success. Thus, the required duration of drying should not depend on reaching the initial layer thickness or the initial layer weight but on the time when the tolerances of the relief layers of the photopolymeric relief printing plates have reached a minimum value, specification of the tolerances being supplemented by statement of the area and of the number of measuring points on the relief layer. This information in its totality would give a drying time during which the amount of residual solvent in the said printing plate reached a value which no longer rendered the printing plate less durable or completely useless under practical conditions. Without such detailed information, it is impossible to check the degree of success or to compare organic developers with one another.

In addition, the two prior German Patent Applications P 3908764.6 and P 3908763.8, which have not been previously published, describe processes of the type stated at the outset, in which emulsions of organic developers and water are used. The organic developers used here are chlorohydrocarbons, saturated and/or unsaturated cyclic hydrocarbons, saturated and/or unsaturated acyclic hydrocarbons, petroleum distillates, hydrogenated mineral oil fractions and/or mixtures thereof, provided that they themselves are nonflammable, poorly flammable and/or high boiling. Mixtures of longchain alkyl esters having alkyl groups of different chain lengths, which however are not specified, are also suitable. These emulsions may furthermore contain from 0.1 to 20% by volume of one or more alcohols, for example n-butanol, n-pentanol, n-hexanol, cyclohexanol, n-heptanol, n-octanol, n-decanol, lauryl alcohol, 3-methyl-3-methoxybutanol, benzyl alcohol or 2,3,5-trimethylhexanol.

It is an object of the present invention further to develop the process stated at the outset in order to obtain a novel, improved process for the production of a flexographic relief printing plate from a photosensitive recording element which no longer has the abovementioned disadvantages of the prior art, even taking into account exact comparison criteria.

We have found that this object is achieved by the surprising finding that the use of two specially selected solvents can overcome the disadvantages of the conventional processes.

The present invention accordingly relates to a novel, improved process for the production of a photopolymeric flexographic relief printing plate from a photosensitive recording element which contains A) a dimensionally stable substrate and
B) at least one photopolymerizable recording layer having
   $b_1$) at least one elastomeric polymer as a binder,
   $b_2$) at least one photopolymerizable monomer which is compatible with the binder $b_1$) and
   $b_3$) at least one photopolymerization initiator, by
(1) imagewise exposure of the photopolymerizable recording layer (B) to actinic light and
(2) washout (development) of the unexposed and therefore nonphotopolymerized parts of the imagewise exposed recording layer (B) with an organic developer with formation of a relief layer, wherein the organic developer contains 3-methoxy-n-butyl acetate and/or n-butyl glycolate or mixtures thereof.

The novel, improved process for the production of a photopolymeric flexographic relief printing plate from a photosensitive recording element is referred to below as novel process for brevity.

For the purposes of the present invention, compatible means the property of two or more components being completely miscible with one another and not separating even after prolonged storage.

The organic developer is essential for carrying out the novel process. Said developer contains either 3-methoxy-n-butyl acetate or n-butyl glycolate. Although these two organic developers may be used together, they are preferably used individually.

According to the invention, it is advantageous if the organic developer which is used in the novel process consists mainly of 3-methoxy-n-butyl acetate or n-butyl glycolate, i.e. one of these two compounds is present in an amount of more than 50, advantageously 70, in particular 80%, by volume in the organic developer used in each case. However, it may also be advantageous if the organic developer consists of either 3-methoxy-n-butyl acetate or n-butyl glycolate.

The novel organic developer may furthermore contain alcohols. The purpose of adding the alcohol is to render soluble, in the organic developer used, any alcohol-soluble top layer (C) present directly on the photopolymerizable recording layer (B) of the photosensitive recording element. Although said top layer (C) could be washed away for this purpose with an alcohol by a special washout step, this necessitates an additional process step, and the addition of an alcohol to the organic developer is therefore preferred when a top layer (C) is present.

It is advantageous for the novel process if the alcohol or alcohols is or are present in an amount of from 0.1 to 30% by volume in the organic developers to be used according to the invention. It is very particularly advantageous if the boiling point or boiling range of the relevant alcohol is matched with the boiling point or boiling range of said organic developer.

Examples of alcohols which are particularly suitable for the intended use according to the invention are benzyl alcohol, isoheptanol, isooctanol, isononanol, 3,5,5-trimethylhexanol, 2-ethylhexanol and the industrial alcohol mixtures sold by Exxon under the trade names or trademarks Exxal 7, 8 and 9.

After they have been used according to the is invention, the organic developers containing 3-methoxy-n-butyl acetate and/or n-butyl glycolate or consisting thereof are worked up in an advantageously simple manner by distillation and reused for the novel process. In particular, the developers containing 3-methoxy-n-butyl acetate or the ester itself can be distilled under atmospheric pressure.

In terms of method, the novel process has no special features, i.e. the photopolymerizable recording layer (B) of the photosensitive recording element is exposed imagewise in a conventional manner and then developed by washing out the unexposed and therefore nonphotopolymerized parts with the organic developers to be used according to the invention, in the known spray and brush washers at from 20° to 60° C., in particular from 20° to 35° C. It is found that the optimum washout times of the novel process are shorter than those of the known procedures and that, in contrast to the known procedures, overwashing, i.e. fragmentation of the material from the relief layer by mechanical action (edge fragmentation), does not occur when the optimum washout times are exceeded. The optimum washout time is the time in which the desired or the maximum relief height is just reached during washout. At the same time, relief layers having pronounced heights and very good side-wall structure are obtained, the surface of these relief layers surprisingly being substantially smoother and more uniform than the surface of relief layers which have been produced by the novel procedure. Furthermore, swelling of the image elements is substantially less than when conventional organic developers are used. An additional surprising advantage of the novel process is that, even after prolonged operation, no deposits occur in the washers or on the photopolymeric flexographic relief printing plates produced. Another advantage of the novel process, which cannot be sufficiently highly rated, is the fact that non-explosion-protected washers can be used for development. In addition, both 3-methoxy-n-butyl acetate and n-butyl glycolate have only a weak or very mild odor. In practice, therefore, neither the washer operators nor the personnel who further handle the photopolymeric flexographic relief printing plates produced are exposed to annoying odors.

When the novel process is carried out, the development step is preceded by conventional imagewise exposure of the photopolymerizable recording layer (B) to actinic light having a wavelength λ of from 230 to 450 nm, in particular from 300 to 450 nm. Examples of light sources suitable for this purpose are sunlight, commercial UV fluorescent tubes, medium pressure, high pressure and low pressure mercury lamps, superactinic fluorescent tubes, pulsed xenon lamps, lamps doped with metal iodides and carbon arc lamps.

The development step is followed in the further course of the novel process by drying of the photopolymeric flexographic relief printing plates. This drying is preferably carried out in a conventional drier, such as a through-circulation drier, at above room temperature, in particular above 50° C. The photopolymeric flexographic relief printing plates obtained by the novel process are dried until their relief layers have once again essentially reached the initial layer thicknesses prior to the swelling caused by the organic developer. It is very particularly advantageous to continue drying until the relief layers have reached tolerances of $\leq 20$ μm, in particular $\leq 15$ μm. Thereafter, the said printing plates produced by the novel procedure also no longer exhibit long-term shrinkage, which forms the basis of their excellent reusability. The drying times within which this aim is achieved are surprisingly and advantageously short.

The tolerances of the relief layers are advantageously determined separately in solid areas of size DIN A3 at 40 measuring points.

The dry photopolymeric flexographic relief printing plates can then be halogenated in halogen-containing or halogen-donating baths, subsequently washed in reducing baths and then dried again. Alternatively to this treatment or thereafter, the said printing plates can be exposed uniformly to actinic light, in particular light having a wavelength λ of <250 nm.

Another advantage of the novel process is that it can be carried out very successfully using many known photosensitive recording elements suitable for the production of photopolymeric flexographic relief printing plates. Such known photosensitive recording elements mainly contain A) a dimensionally stable substrate and
B) at least one photopolymerizable recording layer which contains
   $b_1$) at least one elastomeric polymer as a binder,
   $b_2$) at least one photopolymerizable monomer which is compatible with the binder ($b_1$) and
   $b_3$) at least one photopolymerization initiator, and are also referred to, somewhat inaccurately, as flexographic printing plates by those skilled in the art.

The photopolymerizable recording layer (B) of these flexographic printing plates may furthermore contain other suitable additives, such as thermal polymerization inhibitors, dyes, pigments, photochromic substances, antihalation agents, plasticizers, antioxidants, antiozonants, agents for improving the relief structure, crosslinking agents, flow improvers, parting agents, fillers and/or reinforcing fillers, in effective amounts. The flexographic printing plates may contain a plurality of these photopolymerizable recording layers (B) one on top of the other and firmly bonded to one another, and these layers (B) may have the same or roughly the same composition or different compositions. In addition, such known photosensitive recording elements may have an alcohol-soluble top layer (C) of, for example, polyamide, which layer is present directly on the photopolymerizable recording layer (B).

In carrying out the novel process, particularly advantageously short washout times are obtained if the relevant known photosensitive recording elements have a photopolymerizable recording layer (B) which contains, as binder ($b_1$), vinylaromatic/alkadiene block copolymers (styrene-isoprene-styrene, styrene-butadiene-styrene, styrene-isoprene-styrene/butadiene, etc.), alkadiene/acrylonitrile copolymers (butadiene/acrylonitrile), fluorine rubbers (vinylidene chloride-hexafluoropropylene copolymers), natural rubbers, silicone polymers, polysulfide rubbers or ethylene-propylene-diene terpolymers.

Flexographic printing plates of this type are readily available commercially and are sold, for example, by BASF under the trademarks or trade names Nyloflex ® FA 170, FA 284, FA 470, FAR 284, MA 275 or FO 284, by DuPont de Nemours under the trademarks or trade names CYREL ® HOS 112, PQS 112, DRS 112 or PLS 112, by Asahi Chemical Corp. under the trademark or trade name AFP ® 284, by Grace under the trademark or trade name Flexlight ® KOR 284, formerly belonging to Uniroyal, or by Tokyo Okha Kogyo K.K. under the trademark or trade name Elaslon ® Green 284.

EXAMPLES 1 TO 15

Production of photopolymeric flexographic relief printing plates from commercial flexographic printing plates with the aid of the novel process

General experimental method

Commercial flexographic printing plates which had a photopolymerizable recording layer (B) and a conventional alcohol-soluble top layer (C) of, for example, polyamide (Makromelt ® 6900 from Henkel) on a dimensionally stable substrate (A) were used for Examples 1 to 15.

Table 1 provides information about the composition of the photopolymerizable recording layers (B) of the commercial flexographic printing plates used, or their commercial name is stated. Furthermore, Table 1 states the total thickness (ideal thickness) of the photopolymeric flexographic relief printing plates produced from these commercial flexographic printing plates. This total thickness consists of the thickness of the substrate (A) and the thickness of the relief layer (the top layer (C) is no longer present in the imagewise exposed and developed relief printing plates) and is an important parameter for the reprography department and the printer in practice. All flexographic printing plates of Examples 1 to 15 were first preexposed through their back and then exposed imagewise through a test negative placed on the surface of their top layer (C). The exposure conditions are shown in Table 2.

After the imagewise exposure, the flexographic printing plates of Examples 1 to 15 were washed out in a commercial Nyloflek ® F II rotary, cylindrical brush washer in the novel procedure. During washout, the time after which a relief height of 750 μm, 1000 μm or, if permitted by the thickness, 3000 μm was reached was determined for the individual flexographic printing plates. Table 3 gives an overview of the particular organic developers used and the washout times achieved during development.

The values summarized in Table 3 show that the organic developers to be used according to the invention gave excellent development results in a short time for many different flexographic printing plates. Furthermore, during development of the flexographic printing plates of Examples 1 to 15 at 30° C., there was no odor annoyance which would have necessitated additional ventilation of the workroom.

The photopolymeric flexographic relief printing plates produced by the novel procedure, and their relief layers, showed slight surface swelling after the development process. Table 4 gives an overview of the relevant increase in thickness of the said printing plates. The latter were therefore dried, as is usual in the technical field under discussion here. A through-circulation drier having an air temperature of 60° C. was used for this purpose.

During drying, a check was carried out after half an hour, one hour and two hours to determine the extent to which the increase in layer thickness caused by the development process had declined. The relevant values are likewise summarized in Table 4.

As is evident from Table 4, in the case of the thin photopolymeric flexographic relief printing plates produced by the novel procedure and in the case of those of medium thickness, a drying time of one hour was sufficient to reach, or virtually reach, the initial layer thickness prior to the development process again (cf. Examples 1 and 2, 4 to 13 and 15). After this time, the photopolymeric flexographic relief printing plates of Examples 1 and 2, 4 to 13 and 15 already had tolerances of less than 20 μm. After drying for two hours, some of these plates showed slight shrinkage, which was due to the extraction of low molecular weight components from their imagewise exposed recording layers (B) by the developers to be used according to the invention (cf. Table 4, Examples 1, 2, 5, 7 to 11 and 13).

After these two hours, the photopolymeric flexographic relief printing plates of Examples 1 and 2, 4 to 13 and 15 had reached tolerances of ≦20 μm. After being clamped on printing cylinders, they were therefore very suitable for continuous flexographic printing and, owing to the excellent formation of their relief layers as a result of the novel process, gave excellent printed copies in a particularly long print run. After the printing process, the said printing plates could be stored for several months without any further change in their dimensions as a result of long-term shrinkage. After this long-term storage, the relevant photopolymeric flexographic relief printing plates continued to give excellent printed copies which could not be distinguished from the first editions.

Regarding the thickness of the photopolymeric flexographic relief printing plates of Examples 3 and 14, produced by the novel procedure, the initial layer thickness and tolerances of ≦20 μm were reached after a drying time of two hours at 60° C. so that the relevant printing plates could be used directly for printing cardboard packaging. Due to their excellently formed relief and their dimensional stability, they proved to be extremely stable during the print run and true to detail.

The drying times which were determined using the imagewise exposed and developed flexographic printing plates of Examples 1 to 15 and which were required for reaching tolerances of ≦20 μm, in particular ≦15 μm, were, for safety, compared with the corresponding drying times which had been determined separately with the aid of size DIN A3 flexographic printing plates uniformly exposed and treated with the relevant developers, the determination being carried out at 40 measuring points in each case. The comparison showed agreement within the error limits.

In general, the results of Examples 1 to 15 underline the fact that, with the aid of the novel process, a very wide range of flexographic printing plates can be processed rapidly and reliably, which is essential for reprography in practice.

In addition, the organic developers to be used according to the invention did not give rise to any serious safety and occupational hygiene problems. Thus, in particular the organic developers consumed in carrying out Examples 1 to 13 could be readily worked up by distillation under atmospheric pressure and reused afterward or disposed of without problems, which is an additional advantage of the novel process.

TABLE 1

Composition of the photopolymerizable recording layers (B) of the flexographic printing plates or their commercial names and the thickness d of the photopolymeric flexographic relief printing plates produced therefrom

| Example No. | Composition of the recording layer (B) or the commercial name | [% by weight] | Thickness d of the relief printing plate [without top layer (C)] μm |
|---|---|---|---|
| 1 | Three-block rubber of styrene-isoprene-styrene/butadiene | [82.616] | 1730 ± 15 |
| | White oil S 200 | [5.00] | |
| | α-Methylstyrene (10% by weight)/ p-methylstyrene (90% by weight) cooligomer (Piccotex ® 100) | [5.00] | |
| | Hexane-1,6-diol diacrylate | [3.33] | |
| | Hexane-1,6-diol dimethacrylate | [1.65] | |
| | Benzil dimethyl acetal | [1.20] | |
| | 2,6-Di-tert-butyl-p-cresol | [0.198] | |
| | Sudan Deep Black BB | [0.006] | |
| | Ozone protection wax Antilux ® 550 | [1.00] | |

TABLE 1-continued

Composition of the photopolymerizable recording layers (B) of the flexographic printing plates or their commercial names and the thickness d of the photopolymeric flexographic relief printing plates produced therefrom

| Example No. | Composition of the recording layer (B) or the commercial name [% by weight] | | Thickness d of the relief printing plate [without top layer (C)] μm |
|---|---|---|---|
| | from Rheinchemie | | |
| 2 | As for Example 1 | | 2840 ± 15 |
| 3 | Three-block rubber of Example 1 | [68.098] | 4730 ± 15 |
| | White oil of Example 1 | [13.00] | |
| | Piccotex ® 100 of Example 1 | [5.00] | |
| | Acrylate of Example 1 | [6.70] | |
| | Methacrylate of Example 1 | [3.30] | |
| | Benzil dimethyl acetal | [1.20] | |
| | 2,6-Di-tert-butyl-p-cresol | [0.70] | |
| | Dye of Example 1 | [0.002] | |
| | Ozone protection wax of Example 1 from Rheinchemie | [2.00] | |
| 4 | Three-block rubber of Example 1 | [68.794] | 2860 ± 15 |
| | Chloroparaffin (Hordaflex ® LC 50 from Hoechst) | [13.00] | |
| | 2-Ethylhexyl acrylate | [2.50] | |
| | Piccotex ® 100 of Example 1 | [2.50] | |
| | Acrylate of Example 1 | [6.70] | |
| | Methacrylate of Example 1 | [3.30] | |
| | Benzil dimethyl acetal | [1.20] | |
| | 2,6-Di-tert-butyl-p-cresol | [1.00] | |
| | Dye of Example 1 | [0.006] | |
| | Ozone protection wax of Example 1 | [1.00] | |
| 5 | Three-block rubber of Example 1 | [80.1142] | 2760 ± 15 |
| | Piccotex ® 100 of Example 1 | [7.5] | |
| | Acrylate of Example 1 | [7.32] | |
| | Methacrylate of Example 1 | [3.66] | |
| | Benzil dimethyl acetal | [1.20] | |
| | 2,6-Di-tert-butyl-p-cresol | [0.198] | |
| | Dye of Example 1 | [0.0078] | |
| 6 | Butadiene-acrylonitrile rubber | [65.292] | 2875 ± 15 |
| | Dioctyl phthalate | [23.193] | |
| | Acrylate of Example 1 | [3.63] | |
| | Methacrylate of Example 1 | [3.63] | |
| | Trimethylolpropane triacrylate | [2.42] | |
| | Benzil dimethyl acetal | [0.968] | |
| | 2,6-Di-tert-butyl-p-cresol | [0.447] | |
| | Dye of Example 1 | [0.42] | |
| 7 | Cyrel HOS 112 | | 2850 ± 15 |
| 8 | Cyrel PQS 112 | | 2830 ± 15 |
| 9 | Cyrel DRS 112 | | 2810 ± 15 |
| 10 | Cyrel PLS 112 | | 2830 ± 15 |
| 11 | Styrene-butadiene four-block rubber containing 47% by weight of styrene and 43% by weight of butadiene | [62.98] | 2820 ± 15 |
| | Low molecular weight polybutadiene having a number average molecular weight $M_n$ of 2800 | [30.30] | |
| | Di-2-ethylhexyl fumarate | [4.50] | |
| | Benzil dimethyl acetal | [2.00] | |
| | 2,6-Di-tert-butyl-p-cresol | [0.18] | |
| | Tris-(isooctylphenyl) phosphite | [0.04] | |
| 12 | Styrene-butadiene block rubber containing 35% by weight of styrene and 65% by weight of butadiene, the butadiene part having the following isomer contents: 1,2 - 10%; 1,4-cis - 23% and 1,4-trans - 32% | [63.2] | 2880 ± 15 |
| | Polybutadiene oil | [34] | |
| | Trimethylolpropane triacrylate | [2.1] | |
| | Benzil dimethyl acetal | [0.6] | |
| | 2,6-Di-tert-butyl-p-cresol | [0.1] | |
| 13 | Styrene-isoprene rubber having a styrene content of 13% | [90.8] | 2890 ± 15 |
| | Acrylate of Example 1 | [3.3] | |
| | Methacrylate of Example 1 | [2.1] | |
| | Benzil dimethyl acetal | [1.7] | |
| | 2,6-Di-tert-butyl-p-cresol | [1.7] | |
| | 1,2-Bis-(3',5'-di-tert-butyl-4'-hydroxyphen-1'-yl)-ethane | [0.1] | |
| | n-Paraffin wax (ozone protection wax) | [0.3] | |
| 14 | As for Example 3 | | |
| 15 | As for Example 7 | | |

TABLE 2

Exposure conditions of Example 1 to 15

| Example No. | Preexposure to actinic light (s) | Imagewise exposure to actinic light (min) |
|---|---|---|
| 1 | 25 | 10 |
| 2 | 65 | 10 |
| 3 | 40 | 14 |
| 4 | 80 | 10 |
| 5 | 15 | 10 |
| 6 | 80 | 12 |
| 7 | 60 | 9 |
| 8 | 65 | 9 |
| 9 | 80 | 9 |
| 10 | 80 | 9 |
| 11 | 110 | 18 |
| 12 | 240 | 28 |
| 13 | 120 | 15 |
| 14 | 40 | 14 |
| 15 | 60 | 9 |

TABLE 3

Development of the imagewise exposed flexographic printing plates of Examples 1 to 15 by the novel process

| Example No. | Organic developer Composition [% by vol.] | Development at 20° C.: Development time (min) for relief height of | | | Development at 30° C.: Development time (min) for relief height of | | |
|---|---|---|---|---|---|---|---|
| | | 750 μm | 1000 μm | 3000 μm | 750 μm | 1000 μm | 3000 μm |
| 1 | Butoxyl ®[a] [80] n-Butanol [20] | 5.6 | 8 | — | 4 | 7.2 | — |
| 2 | Butoxyl ®[a] [80] n-Butanol [20] | 5.6 | 8 | — | 4 | 7.2 | — |
| 3 | Butoxyl ®[a] [80] 2-Ethylhexanol [20] | — | — | 14 | — | — | 11 |
| 4 | Butoxyl ®[a] [80] n-Pentanol [20] | 5.6 | 8 | — | 4 | 7.2 | — |
| 5 | Butoxyl ®[a] [80] 2-Ethylhexanol [20] | 5 | — | — | 4 | — | — |
| 6 | Butoxyl ®[a] [80] 2-Ethylhexanol [20] | 7 | 9.6 | — | 5.6 | 8 | — |
| 7 | Butoxyl ®[a] [80] 2-Ethylhexanol [20] | 5.6 | 7 | — | 4 | 5.6 | — |
| 8 | Butoxyl ®[a] [80] n-Pentanol [20] | 15 | 21 | — | 12 | 18 | — |
| 9 | Butoxyl ®[a] [80] 2-Ethylhexanol [20] | 7 | 9.6 | — | 5.6 | 8 | — |
| 10 | Butoxyl ®[a] [80] n-Pentanol [20] | 6 | 9 | — | 5 | 6.5 | — |
| 11 | Butoxyl ®[a] [80] 2-Ethylhexanol [20] | 5 | 6.5 | — | 3 | 5 | — |
| 12 | Butoxyl ®[a] [80] 2-Ethylhexanol [20] | 5 | 7 | — | 4 | 5.6 | — |
| 13 | Butoxyl ®[a] [80] 2-Ethylhexanol [20] | 13 | 20 | — | 11 | 17 | — |
| 14 | Polysolvan ® O[b] [100][c] | — | 16 | 22 | — | 13 | 18 |
| 15 | Polysolvan ® O[b] [100][c] | 16 | 20 | — | 12 | 16 | — |

[a] Registered trademark of Hoechst AG. 3-methoxy-n-butyl acetate
[b] Registered trademark of Hoechst AG. n-butyl glycolate
[c] The top layer (C) of the flexographic printing plates was washed away with n-butanol before the actual development with Polysolvan ® O

TABLE 4

Swelling and drying behavior of the photopolymeric flexographic relief printing plates of Examples 1 to 15, produced by the novel procedure Thickness d and increase in thickness Δd of the relief printing plates in μm after

| Example No. | exposure (= initial layer thickness) | | development | | drying for ½ hour at 60° C. | | drying for 1 hour at 60° C. | | drying for 2 hours at 60° C. | |
|---|---|---|---|---|---|---|---|---|---|---|
| | d | Δd | d | Δd | d | Δd | d | Δd | d | Δd |
| 1 | 1730 | ±0 | 1810 | +80 | 1760 | +30 | 1740 | +10 | 1710 | −10 |
| 2 | 2840 | ±0 | 2845 | +55 | 2865 | +25 | 2845 | +5 | 2835 | −5 |
| 3 | 4730 | ±0 | 4860 | +130 | 4790 | +60 | 4765 | +35 | 4745 | +15 |
| 4 | 2860 | ±0 | 2940 | +85 | 2880 | +20 | 2870 | +10 | 2860 | ±0 |
| 5 | 2760 | ±0 | 2800 | +40 | 2770 | +10 | 2765 | −5 | 2745 | −15 |
| 6 | 2875 | ±0 | 2975 | +100 | 2905 | +40 | 2890 | +15 | 2885 | +10 |
| 7 | 2850 | ±0 | 2960 | +110 | 2895 | +45 | 2870 | +20 | 2845 | −5 |
| 8 | 2830 | ±0 | 2860 | +30 | 2850 | +20 | 2840 | +10 | 2825 | −5 |
| 9 | 2810 | ±0 | 2890 | +80 | 2845 | +35 | 2815 | +5 | 2795 | −15 |
| 10 | 2830 | ±0 | 2920 | +90 | 2870 | +40 | 2830 | ±0 | 2820 | −10 |
| 11 | 2820 | ±0 | 2930 | +110 | 2860 | +40 | 2820 | ±0 | 2795 | −25 |
| 12 | 2880 | ±0 | 2970 | +90 | 2900 | +20 | 2890 | +10 | 2865 | ±0 |
| 13 | 2890 | ±0 | 2935 | +45 | 2915 | +25 | 2900 | −10 | 2890 | −25 |
| 14 | 4730 | ±0 | 4820 | +90 | 4780 | +50 | 4770 | +40 | 4750 | +20 |

TABLE 4-continued

Swelling and drying behavior of the photopolymeric flexographic relief printing plates of Examples 1 to 15, produced by the novel procedure

| Example No. | exposure (= initial layer thickness) | | development | | drying for ½ hour at 60° C. | | drying for 1 hour at 60° C. | | drying for 2 hours at 60° C. | |
|---|---|---|---|---|---|---|---|---|---|---|
| | d | Δd | d | Δd | d | Δd | d | Δd | d | Δd |
| 15 | 2850 | ±0 | 2925 | +75 | 2890 | +40 | 2865 | +15 | 2850 | ±0 |

COMPARATIVE EXPERIMENTS C1 TO C13

Production of photopolymeric flexographic relief printing plates from commercial flexographic printing plates by a known process

General experimental method

Examples 1 to 13 were repeated, except that 2-butoxyethyl acetate was used instead of the 3-methoxy-n-butyl acetate to be used according to the invention. Apart from the fact that the washout times and the drying times in Comparative Experiments 1 to 13 were on average 1.5 times longer than the corresponding times of Examples 1 to 15, it was also necessary to take special safety measures to ensure that the operators of the washers did not come into contact with the ester.

We claim:

1. A process for the production of a photopolymeric flexographic relief printing plate from a photosensitive recording element which comprises
   A) a dimensionally stable substrate and
   B) at least one photopolymerizable recording layer having
      $b_1$) at least one elastomeric polymer as a binder,
      $b_2$) at least one photopolymerizable monomer which is compatible with the binder ($b_1$) and
      $b_3$) at least one photopolymerization initiator,
   by
   (1) imagewise exposure of the photopolymerizable recording layer (B) to actinic light and
   (2) washout (development) of the unexposed and therefore nonphotopolymerized parts of the imagewise exposed recording layer (B) with an organic developer with formation of a relief layer,
wherein the organic developer consists essentially of 3-methoxy-n-butyl acetate or n-butyl glycolate or a mixture of n-butyl glycolate and 3-methoxy-n-butyl acetate.

2. A process as defined in claim 1, wherein the organic developer contains at least one alcohol.

3. A process as defined in claim 2, wherein the alcohol is present in an amount of from 0.1 to 30% by volume in the organic developer.

4. A process as defined in claim 2, wherein the boiling point or the boiling range of the alcohol is matched with the boiling point or the boiling range of the organic developer.

5. A process as defined in claim 3, wherein the boiling point or the boiling range of the alcohol is matched with the boiling point or the boiling range of the organic developer.

* * * * *